United States Patent [19]

Guedon et al.

[11] Patent Number: 4,975,388
[45] Date of Patent: Dec. 4, 1990

[54] METHOD OF FORMING EPITAXIAL LAYERS

[75] Inventors: Christophe Guedon, Lesigny; Jean-Louis Gentner, Caen, both of France

[73] Assignee: U.S. Philips Corporation, New York, N.Y.

[21] Appl. No.: 357,143

[22] Filed: May 25, 1989

[30] Foreign Application Priority Data

Jun. 3, 1988 [FR] France .................................. 88 07428

[51] Int. Cl.⁵ .......................................... H01L 21/20
[52] U.S. Cl. .......................... 437/133; 148/DIG. 72; 148/DIG. 97; 156/613; 437/81; 437/939; 437/945
[58] Field of Search .................... 148/DIG. 25, 22, 41, 148/56, 57, 65, 72, 97, 110, 119, 127, 169, 33, 33.4; 156/610-614; 427/248.1, 255.1; 437/81, 95, 96, 105, 107, 108, 110, 111, 126, 129, 133, 939, 945, 976, 971

[56] References Cited

U.S. PATENT DOCUMENTS

| | | | |
|---|---|---|---|
| 3,888,705 | 6/1975 | Fletcher et al. | 437/81 |
| 4,407,694 | 10/1983 | Eu et al. | 156/613 |
| 4,488,914 | 12/1984 | Quinlan et al. | 437/133 |
| 4,507,169 | 3/1985 | Nogami | 156/614 |
| 4,610,731 | 9/1986 | Chevallier et al. | 437/22 |
| 4,808,551 | 2/1989 | Mori et al. | 437/81 |
| 4,843,037 | 6/1989 | Yablonovitch et al. | 437/235 |
| 4,873,558 | 10/1989 | Antreasyan et al. | 357/23.2 |

FOREIGN PATENT DOCUMENTS 0140318 11/1982 Japan .
2192198 6/1988 United Kingdom .

OTHER PUBLICATIONS

Gentner et al., ". . . Low Pressure GaAs VPE in the Chloride System", J. Crys. Growth, vol. 56, 1982, pp. 332-343.

Mikawa et al., "InP/InGaAs PIN Photodiodes . . . ", Fujitsu Sci. Tech. J., vol. 20, No. 2, Jun. 1984, pp. 201-218.

Kodama et al., "Optical Investigation of MQW System InP-InGaAs-InP", J. Vac. Sci. Technol. B, vol. 1, No. 3, Jul.-Sep. 1983, pp. 696-699.

Komeno et al., "InGaAs/InP Superlattice Grown by Vapor-Phase Epitaxy . . . ", Jpn. J. Appl. Phys., vol. 30, 1 Sep. 1984, pp. 567-570.

Jurgensen et al., "Vapor Phase Growth of InP . . . ", J. Crys. Growth, vol. 66, No. 1, Jan./Feb. 1984, pp. 73-82.

Guedon et al., "Control of Interface Formation During Growth of InGaAs/InP . . . ", vol. 79, 1986, pp. 909-913.

Primary Examiner—Olik Chaudhuri
Assistant Examiner—William Bunch
Attorney, Agent, or Firm—Norman N. Spain

[57] ABSTRACT

A method of manufacturing a semiconductor device comprising at least the step of forming by a so-called method of deposition from the chloride vapour phase two superimposed epitaxial layers, the lower layer being made of a ternary compound and the upper layer being made of a binary compound, both of a semiconductor material of the III-V group, characterized in that the operating conditions of deposition temperature and molar fractions of the compounds required to form the layers are chosen so that both the lower layer of ternary material and the upper layer of binary material have before, during and after the transient state corresponding to the passage from the lower layer to the upper layer a maximum rate of coverage with chlorine (Cl) atoms.

Application: hetero-structure GaInAs/InP for opto-electronic integrated circuits.

10 Claims, 4 Drawing Sheets

METHOD OF FORMING EPITAXIAL LAYERS

The invention relates to a method of manufacturing a semiconductor device, which includes at least the step of forming by a so-called chloride vapor phase deposition method two juxtaposed epitaxial layers, the lower layer being made of a ternary compound and the upper layer being made of a binary compound, both of a semiconductor material from the III–V group.

The invention is used for forming hetero-structure of GaInAs/InP for optoelectronic applications, among which can be mentioned: integrated lasers, PIN photodiodes, avalanche photodiodes, quantum well structures or superlattice structures, buried optical guides, integrated phase modulators, etc.

For all these envisaged applications, it is essential to form from semiconductor compounds of the III–V group juxtaposed epitaxial layers, of which:
the composition,
the electrical quality,
the crystallographic quality,
the thickness,
the thickness of the interface region between two layers,
are very accurately controlled.

Among the known methods of forming epitaxial layers, a method designated as "epitaxial growth from the chloride vapor phase" has yielded very satisfactory results as to:
the composition,
the electrical quality,
the crystallographic quality of the epitaxial layers formed from III–V compounds.

However, hitherto the thickness of the thin epitaxial layers and the thickness of the interface region between two layers of different III–V compounds were poorly controlled, as shown in the publication by C. Guedon et alii in "Journal of Crystal Growth 79 (1986), North Holland, Amsterdam", pp. 909–913.

This document discloses a method of epitaxial growth from the chloride vapor phase to obtain alternate layers of GaInAs and InP. This method comprises on the one hand the thermal decomposition of arsenic trichloride ($AsCl_3$) and of phosphorus trichloride ($PCl_3$) in a flow of hydrogen to obtain arsenic ($AS_4$), phosphorus ($P_4$) and hydrochloride (HCl). The products of the decomposition of the trichlorides are then caused to react with sources of binary material of gallium arsenide (GaAs) and indium phosphide (InP), respectively, which sources are solid at the temperatures used (700° C. to 800° C.).

The hydrochloride formed during the decomposition of the trichlorides reacts especially with these sources so that gallium chloride (GaCl) and arsenic ($AS_4$) and indium chloride (InCl) and phosphorus ($P_4$), respectively, are obtained.

This method comprises on the other hand the formation of hydrochloride by the thermal decomposition of arsenic trichloride ($AsCl_3$) in a furnace in an atmosphere of hydrogen followed by the condensation of the arsenic on the cold walls of a tube. The hydrochloride thus formed is taken, like the flow of hydrogen, to a source of indium (In) in such a manner that in the region of this source, by reaction of hydrochloride at high temperature with indium, indiumchloride and hydrogen are obtained.

According to the aforementioned document, for the growth of the epitaxial layers of GaInAs there are available:
a flow of $GaCl + AS_4 + HCl$,
a flow of InCl,
a flow of hydrogen
and for the expitaxial growth of the layers of InP there are available:
a flow of $InCl + P_4 + HCl$,
a flow of InCl,
a flow of hydrogen.

This document indicates that at deposition temperatures of the order of 620° to 650° C. during the epitaxial growth of a layer of InP followed by a layer of GaInAs an intermediate quaternary layer is formed having a thickness of the order of 1.6 nm for 620° C. and 1.2 nm for 650° C., which can be acceptable for the envisaged optoelectronic applications.

On the other hand, however, during the epitaxial growth of an epitaxial layer of GaInAs followed by the epitaxial growth of InP, an intermediate quaternary layer is formed having a thickness of the order of 7.9 nm for a deposition temperature of 620° and 5.5 nm for a deposition temperature of 650° C.

According to the afornentioned document, the increase of the deposition temperature would have a beneficial effect on the reduction of the undesired interface layer and especially a deposition temperature at least equal to 650° C. should be recommendable.

Other conditions should moreover be recommendable to obtain the reduction of the thickness of the interface layer, such as:
the increase of the molar fractions of InCl and of GaCl in the growth of GaInAs to obtain the reduction of the rate of growth of this layer;
the reduction of the rate of growth of InP whilst utilizing only the flow of $InCl + P_4$ originating from the action of HCl on the source of InP instead of utilizing together the flows of InCl originating from the solid source of InP and from the liquid source of In.

In spite of different tests carried out in these different conditions, the results published by the aforementioned document remain poor and especially a thickness of the interface layer during the passage from the layer of GaInAs to the layer of InP of less than 5.5 nm is never obtained.

Now it is essential, for example, for the manufacture of quantum well devices to first process a layer of GaInAs of small thickness, typically of 10 nm, on which is disposed a layer of InP of large thickness, typically of 500 nm. It can therefore be seen that, if between these layers an undesired quaternary interface layer is formed, which has a thickness close to that of the subjacent layer of GaInAs, the envisaged devices cannot be of high quality.

The same problem arises for the manufacture of all the devices which include a layer of GaInAs as buffer or confinement layer.

Therefore, the present invention proposes a method of manufacturing, which permits of obtaining interface layers of very small thickness during the passage from a ternary layer of a III–V compound, such as GaInAs, to a binary layer of a III–V compound, such as InP.

According to the invention, this result is obtained in that a method of the kind defined in the opening paragraph is effected in operating conditions in which both the lower layer of ternary material and the upper layer of binary material have before, during and after the transient state corresponding to the passage from the lower layer to the upper layer a maximum rate of coverage with chlorine (Cl) atoms.

During the formation of a layer of gallium indium arsenide (GaInAs) followed by the formation of a layer of indium phosphide (InP), these conditions are obtained in that, in order to obtain a high rate of coverage with chlorine (Cl) of the layer of GaInAs, a low deposition temperature is chosen and in that, in order to obtain a high rate of coverage with chlorine (Cl) of the layer of InP a high indium chloride pressure during the formation of the layer of InP is chosen.

According to the invention, for the formation of these particular layers, the deposition temperature is considered to be low in the range of from 600° to 640° C., the pressure of InCl is considered to be high in the range in which the molar fraction of InCl which reacts lies between $2 \cdot 10^{-3}$ and $2 \cdot 10^{-2}$, and the factors deposition temperature of GaInAs and fraction of InCl during the deposition of InP are chosen in these ranges whilst taking into account the fact they cooperate in reverse ratio to each other.

In these conditions, the following advantages are inter alia obtained:
  the rate of growth of the ternary layer of GaInAs is low, which permits of accurately controlling the growth of layers of small thickness generally required for this material (mostly a desired value is 10 nm);
  the thickness of the undesired interface layer of aleatory quaternary composition is about 1 nm, which represents 0.1 of the thickness of the layer of GaInAs when the latter has been chosen to be 10 nm and is therefore perfectly acceptable;
  the rate of growth of the binary layer of InP on the contrary is high, which is very satisfying because in general it is required to form layers of InP of larger thickness (Y 500 nm) than that of the ternary lower layers.

The invention will be more clearly understood by means of the following description illustrated by the accompanying Figures, among which.

For the understanding of the present invention, it is necessary to first consider the physical phenomena, which play a part in the formation of the epitaxial layers of III-V material process by the method of deposition from the chloride vapor phase. It will appear from the explications given below that these phenomena were already well known before the present invention, but that this advance knowledge paradoxically leads to methods of manufacturing which include completely erroneous operating conditions.

According to the present invention, on the contrary, the knowledge of the functions of each of the elements playing a part in the epitaxial growth, that is to say the deposition temperature and the pressures of the gaseous compounds, permits of causing these elements to cooperate by a new means, which results in a new function, which leads to a new result and permits of solving the arising technical problem.

In fact it has been found that according to the prior art during the formation of a layer of GaInAs on a layer of InP an interface layer of quaternary material of aleatory composition having a small thickness was obtained, while during the formation of a layer of InP on a layer of GaInAs, this interface layer was 5 to 10 times thicker, which did not permit of obtaining optoelectronic devices of satisfying quality.

The technical problem solved by the present invention is therefore first to reduce the thickness of the undesired interface layer between the ternary material and the binary material and then to obtain the control of the rate of growth of each of these layers whilst using the method of deposition from the chloride vapor phase, which yields layers of very high quality at low manufacturing cost with respect to other methods of forming layers, such as growth by molecular beam epitaxy (MBE).

Figure 1:
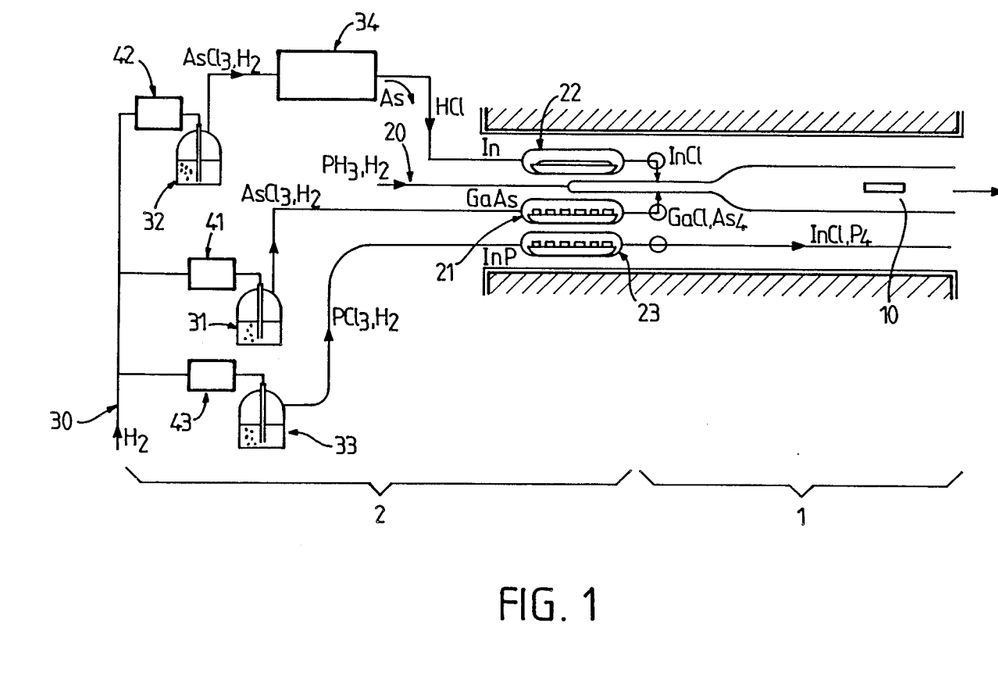
FIG. 1 shows diagrammatically a reactor of epitaxy from the chloride vapor phase.

For this purpose, first the epitaxy reactor will be described, which is used to carry out the invention. A reactor suitable to form epitaxial layers of GaInAs and of InP by the method of chloride deposition is shown in FIG. 1. Other devices are known, such as, for example, that of French Patent Application No. 8607538, and are also suitable for this manufacture.

Moreover, other layers of semiconductor materials can also be formed in these reactor types with similar methods provided that they have similar growth properties.

As shown in FIG. 1, the reactor mainly comprises a part 1, which receives the sample or deposition chamber and which is brought to the deposition temperature, and a part 2 in which the reacting gases are processed.

In the embodiment described hereinafter, the substrate is first prepared in the following manner: A wafer is cut out of a block of indium phosphide (InP), which has been obtained by the Czochralski method with encapsulation. The wafer is ground and then polished mechanochemically with a bromine methanol solution. The crystallographic orientation of the surface plane is (001) misorientated by 3° or 6° with respect to the (110) plane, preferably about the axis [1$\bar{1}$0].

In order to make the substrate semi-insulating, it may be doped, for example, with iron (Fe) at a concentration of about $10^{16}$ atoms/cm$^3$. Substrates of the n conductivity type may also be used, in accordance with the envisaged type of semiconductor devices. The doping of the substrate can then be obtained by means of sulphur (S) atoms at a concentration of $5.10^{18}$ to $10^{19}$ atoms/cm$^3$.

The substrate must then be cleaned, for example by chemical means, before any epitaxial growth. A chemical cleaning may be effected, for example, by the sequence of operations of:
  degreasing in boiling trichloroethylene and then in isopropanol;
  rinsing in de-ionized water;
  etching in a solution of $H_2SO_4/H_2O_2/H_2O$;

rinsing in de-ionized water of ultra-high purity.

Experience has shown that the sample thus prepared is coated with a fine layer of oxide of about 0.5 to 1 nm, which will be thermally eliminated in the reactor. This layer is mainly composed of $InPO_4$, but may also be constituted by $In_2O_3$, $In(OH)_3$.

The sample or substrate of InP thus prepared is introduced into the deposition chamber 10 of the epitaxy reactor, in which it must be brought to the deposition temperature $T_d$.

The InP compound having a comparatively low congruent evaporation temperature, the surface of the substrate is degraded in a hydrogen atmosphere at high temperature. In fact, above this congruent point, the phosphorus evaporates more rapidly than the indium of the surface. Thus, depending on whether a sample of InP is at an elevated temperature in a closed space or not, the congruent evaporation point is 361° C. and 365° C. respectively. At a temperature above this congruent point, a high loss of $P_2$ is observed at the surface.

In order to avoid this degradation of the surface, the surface is held in a phosphorated atmosphere as soon as the temperature of the reactor reaches 300° C., due to phosphine ($PH_3$) introduced at the inlet 20.

The second part 2 of the reactor comprises the sources from which the reacting gases are prepared.

As is shown in FIG. 1, gaseous hydrogen is taken to the inlet 30 through filters 41, 42 and 43, respectively, in bubbling devices 31, 32 and 33, respectively, with flow rates of $D_1$, $D_2$ and $D_3$, respectively. The bubbling devices 31 and 32 contain the compound $AsCl_3$ and the bubbling device 33 contains the compound $PCl_3$ at temperatures $t_1$, $t_2$ and $t_3$, respectively. On the other hand, at the inlet 20, gaseous hydrogen is taken to the inlet 20 with a flow rate $D_o$. The knowledge of the different flow rates of gas and of the temperatures of the compounds in the bubbling devices permits of knowing the quantities of material taken along or the molar fractions of material playing a part in the reactions from relations known to those skilled in the art, as will be set out hereinafter.

The trichlorides are first decomposed thermally in a hydrogen atmosphere according to the reactions:

$$AsCl_3 + 3/2H_2 \rightarrow 3HCl + \tfrac{1}{4}As_4 \qquad (1a)$$

$$PCl_3 + 3/2H_2 \rightarrow 3HCl + \tfrac{1}{4}P_4 \qquad (3a).$$

In the embodiment described here, the product of the reactions (1a) and (3a) are taken to first and second sources 21 and 23, respectively, of binary materials of GaAs and InP, respectively, which are solid at the temperatures used typically, that is to say 700° C. to 800° C. These sources can be replaced by metallic liquid sources saturated with arsenic or with phosphorus.

In the case of the solid sources, the reactions are written as $$3HCl + 3GaAs \rightarrow 3GaCl + \tfrac{3}{4}As_4 + 3/2H_2 \qquad (1b)$$

and $$3HCl + 3InP \rightarrow 3InCl + \tfrac{3}{4}P_4 + 3/2H_2 \qquad (3b),$$

respectively.

In the case of the liquid sources, the reactions are slightly complexer.

In order to carry out the method of epitaxial growth from the chloride vapor phase according to the invention, a third source must moveover be available.

This third source is used to product gaseous InCl. HCl gas is first prepared from, for example, arsenic trichloride ($AsCl_3$)—coming from the bubbles 32, taken along by $H_2$ which comes through inlet 30 and filter 42 which guarantees a high purity of the hydrochloride gas—and is then used to obtain InCl.

The reaction of obtaining HCl gas is effected in a furnace 34; gaseous arsenic is then formed at high temperature, which is then deposited on the cold walls of a quartz tube. The thermal decomposition reaction of arsenic trichloride in a hydrogen atmosphere is written as:

$$AsCl_3 + 3/2H_2 \rightarrow 3HCl + As \qquad (2a)$$

The hydrochloride is taken to said third source 22 of liquid indium, from which it results that:

$$\text{liquid } HCl + In \rightarrow InCl \qquad (2b)$$

The difference between the input pressures in the epitaxial deposition chamber on the substrate 10 of the different gaseous species and those in thermodynamic equilibrium with the solid material leads to the epitaxial growth.

Epitaxial Growth of GaInAs

Figure 2:
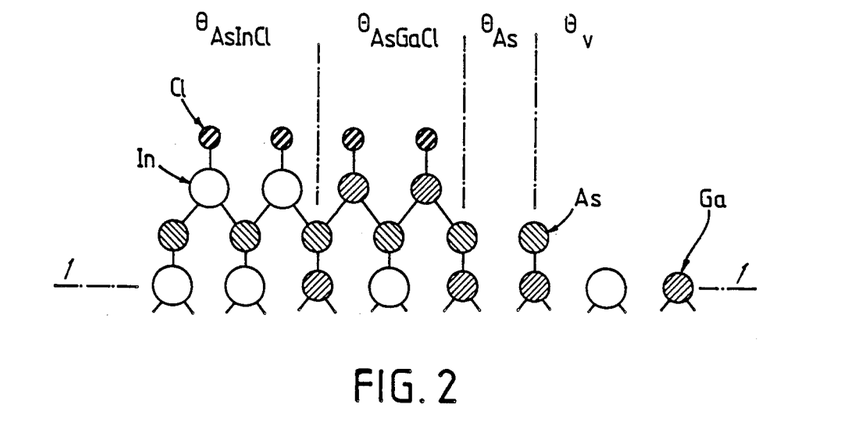
FIG. 2 shows the atomic state of the upper surface of an epitaxial layer of GaInAs during processing by the method of deposition from the chloride vapor phase.

Consider first the epitaxial growth of the GaInAs. As shown in FIG. 2, if a reference plane J-I the layer of In and Ga atoms is chosen, the layer which is formed first immediately on this layer of InGa is formed in part:

of As species with a rate of coverage $\theta(As)$
of AsGaCl species at a rate of coverage $\theta(AsGaCl)$
of species of AsInCl at a rate of coverage $\theta(AsInCl)$
of vacancies at a rate of coverage $\theta_v$.

In accordance with what appears from the foregoing, the growth of GaInAs is due to the reactions:

(coming from first source 21)

$$GaCl + \tfrac{1}{4}As_4 + \tfrac{1}{2}H_2 \rightarrow GaAs + HCl \qquad (1c)$$

(coming from first source 21)

$$InCl + \tfrac{1}{4}As_4 + \tfrac{1}{2}H_2 \rightarrow InAs + HCl \qquad (2c).$$

The elementary reactions occurring between the surface and the gaseous phase are:

$$\text{an empty site} + \tfrac{1}{4}As_4 \rightarrow As \text{ (adsorbed)} \qquad (6a)$$

$$\text{a site of } As + GaCl \rightarrow AsGaCl \text{ (adsorbed)} \qquad (6b)$$

$$\text{a site of } As + InCl \rightarrow AsInCl \qquad (6d)$$

a site of $AsGaCl + H_2 \rightarrow GaAs + HCl + H$ interstitial
(desorption of the chlorine) \qquad (6e)

$$\text{a site of } AsInCl + H_2 \rightarrow InAs + HCl + H \text{ interstitial} \qquad (6f).$$

The remaining H atom does not influence the global reaction, which would be the case if it occupied an empty site. Thus, it is conceivable that it will taken an interstitial site at the surface and that an equilibrium exists with $H_2$ (gas). However, this state of equilibrium does not exert any effect on the phenomenon interesting for us. It should further be noted that in the reaction of adsorption of As, the result is a coverage with elementary arsenic (As).

A kinetic model has been worked out which describes the growth of GaInAs whilst supposing that the global kinetics correspond to the reactions (3b) (6d) and (6e), according to which model:

$$\theta_v + \theta(As) + \theta(AsGaCl) + \theta(AsInCl) = 1$$

and according to which the rate of growth R (GaInAs) is given by:

$$R(GaInAs) = R(GaAs) + R(InAs).$$

The rate of growth R(GaAs) of GaAs is a function of the rate of coverage $\theta(AsGaCl)$ and the rate of growth R(InAs) of InAs is a function of the rate of coverage $\theta(AsInCl)$, which are functions especially of the pressures p (GaCl) of GaCl and p (InCl) of InCl, respectively, and of the deposition temperature $T_D$. It should be noted that in the manufacturing method effected here, a pressure ratio should be maintained:

$$p(InCl)/p(GaCl) = \text{constant}.$$

This constant is determined to ensure that the gallium indium arsenide has a formula:

$$Ga_{0.47}In_{0.53}As$$

suitable to obtain correspondence of lattice with indium phosphide (InP).

Figure 5A:
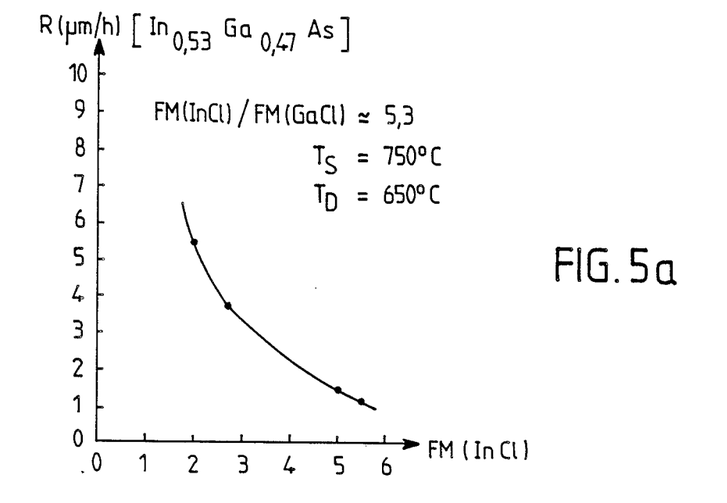
FIG. 5a shows the rate of growth of GaInAs at $T_D=650°$ C. as a function of the molar fraction of InCl.

Experience has shown that for deposition temperatures:

$$T_D \geq 650° \text{ C.}$$

the rate of growth R(GaInAs) of GaInAs is especially a function of the pressure of InCl. Especially the rate of growth of GaInAs increases very rapidly when the pressure of InCl decreases. In this temperature range, in order to decrease the rate of growth, it is therefore necessary to increase the pressure of InCl, which is also expressed by the increase of the molar fraction of InCl, MF(InCl), which reacts as shown in FIG. 5a for the temperature of 650° C.

This tendency indicates the increase of the rate of coverage with chlorine $$\theta((AsInCl) + \theta(AsGaCl);$$

At the temperature of 650° C. and at the higher temperatures, a high rate of coverage with chlorine, which leads to blocking of the surface required, is obtained only at the extreme high values of the molar fraction of InCl MF(InCl), as shown in FIG. 5a, which result in practical disadvantages, such as inter alia:
 a poor efficiency of source materials,
 a large number of defects in the layers.

It should be noted that the relation between the MF(InCl) and the pressures $p_1(AsCl_3)$ and $p_3(PCl_3)$ influencing the process (cf. relations 1a and 3a) is given as a function of the flow rates $D_1$, $D_3$ in the bubbling devices 32 and 33 and of the flow rate $D_0$ of the hydrogen $H_2$ entering the reactor at 20 (cf. FIG. 1) by the formula $$MF(InCl) \simeq [3D_1 \cdot p_1(AsCl_3) + 3D_3 \cdot p_3(PCl_3)]/(D_1 + D_3 + D_0).$$

The pressures $p_1$ and $p_3$ are themselves given in such a system by evaporation laws known from "Handbook of Chemistry and Physics, 51$^{st}$ Edition, 1970–1971, pp. D 116–D 169, published by: The Chemical Rubber Co.".

Moreover it will be considered that:

$$MF(InCl\alpha p(InCl) \text{ (the pressure of InCl).}$$

On the contrary, when the deposition temperature $$T_D < 650° \text{ C.}$$

the growth rate R(GaInAs) of GaInAs is controlled by the value of the rates of coverage, even for moderate values of the MF(InCl), such as for example, $2 \cdot 10^{-3}$ to $4 \cdot 10^{-3}$.

In this deposition temperature range, it is found that: the chloric species coverage rates are high with respect to other coverage rates $= \theta(AsGaCl) + \theta(AsInCl) >> \theta_v + \theta(As)$.

Therefore, there are only a few vacancies and a few As sites at the deposition surface. It could be conceivable that due to the high rates of coverage with chloric species AsGaCl and AsInCl the rate of growth of GaInAs will be high.

This is not the case. In this deposition temperature range, the rate of growth of GaInAs is low. This is due to the existence of attractive lateral interactions between the complexes adsorbed at AsGaCl and AsInCl. When the chloric species coverage rates $\theta(AsGaCl)$ and $\theta(AsInCl)$ become high, these interactions inhibit the desorption of chloric species by hydrogen (relations 6b) and 6d) and therefore limit the rate of growth.

EPITAXIAL GROWTH OF InP

Now consider in the second place the epitaxial growth of a layer of InP.

Figure 3:
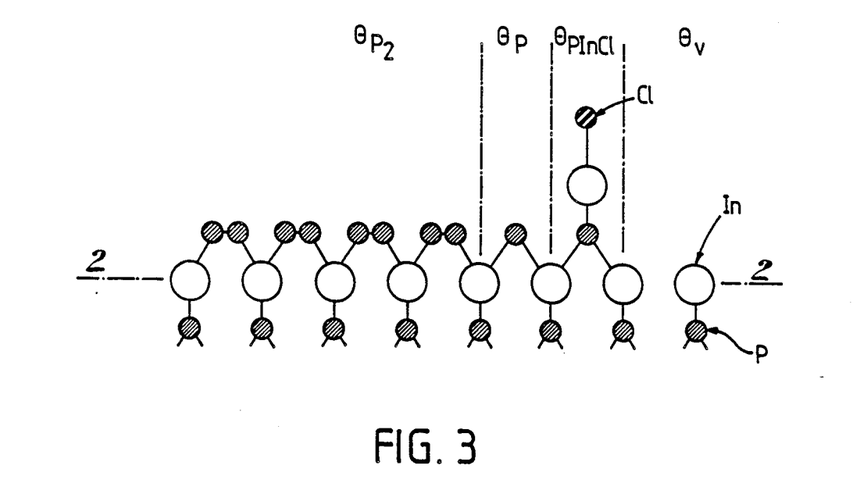
FIG. 3 shows the atomic state of the upper surface of an epitaxial layer of InP during processing by the method of deposition from the chloride vapor phase

According to what appears from the foregoing, the growth of InP is due to the global reaction:

(coming from second source 23)
$$InCl + \tfrac{1}{4}P_4 + \tfrac{1}{2}H_2 \rightarrow InP + HCl \quad (3c).$$

As shown in FIG. 3, if the layer of In atoms is chosen as reference plane, the layer which is first formed immediately on the layer of In is composed of
 species $P_2$ at a rate of coverage $\theta(P_2)$
 species P at a rate of coverage $\theta(P)$
 species PInCl at a rate of coverage $\theta(PInCl)$
 vacancies at a rate of coverage $\theta_v$.

The epitaxial growth is due to the elementary reactions between the surface and the gaseous phase:

a site $InCl + \tfrac{1}{4}P_4 \rightarrow PInCl$ (adsorbed) (7a)

a site $PInCl + H_2 \rightarrow InP + HCl + H$ interstitial
(desorption of chlorine). (7b)

The energy of adsorption of $P_2$ as a site is of the order of $-59$ to $-63$ kcal/mol, while that of two phosphorus atoms is only $-28$ kcal/mol. Therefore, the rate of coverage with the molecule $P_2$ is much higher than that of monoatomic phosphorus.

$$\theta(P_2) >> \theta(P).$$

On the other hand, the energy of the connection P—P of the molecule $P_2$ is estimated at $-105$ kcal/mol. This molecule will therefore by very stable.

According to FIG. 3, in order that there is epitaxial growth of InP, $\theta(PInCl)$ must be increased and $\theta(P_2)$ must be decreased. The rate of growth of InP is maximum when the rate of coverage $\theta(PInCl)$ is maximum, in the case in which $\theta(P_2)$ is high. This is greatly different from the growth of GaInAs due to the large coverage with $P_2$, which dominates and renders negligible the interactions between adsorbed complexes PInCl. In the case of GaInAs, the effect of the interactions between AsGaCl and AsInCl leads to a maximum of R(GaInAs), the rate of growth of GaInAs, for $\theta(Cl)=\frac{1}{2}$. This is not the case for InP as long as $\theta(P_2)\simeq 1$. Moreover, experience has shown that, if the deposition temperature $T_D$ is caused to vary, in contrast with what happens during the growth of GaInAs, the rates of coverage remain substantially constant due to the fact that $\theta(P_2)$ dominates $[\theta(P_2\simeq 1]$. If the rate of growth of InP should be caused to vary, other factors must be acted upon.

When calculating the rate of growth of InP from the relation (7b), it is found that this rate moveover is a function of the pressures p(p), p(InCl).

Figure 5B:
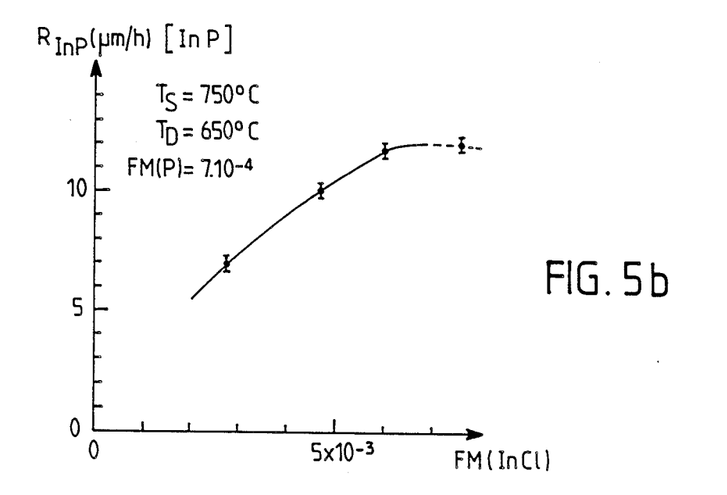
FIG. 5b shows the rate of growth of InP at $T_D=650°$ C. as a function of the molar fraction of InCl.

As is shown in FIG. 5b, the pressure of P being constant, the rate of growth of InP increases when the pressure of InCl increases because $\theta(PInCl)$ increases. An oversaturation is apparent only at very high values of MF(InCl).

Experience has shown that $\theta(PInCl)$ is maximum for a pressure of InCl corresponding to a molar fraction of InCl MF(InCl)$\simeq 7\cdot 10^{-3}$ in the case of FIG. 5b.

Let us finally analyse the conditions which appear at the instant at which the growth of GaInAs is stopped and the growth to InP is started.

The quaternary layer of variable composition and of large thickness which appeared according to the prior art during this step was due to the fact that this transient state of growth was uncontrolled and uncontrollable.

According to the invention, the use of a deposition temperature $T_D<650°$ C. is an essential element for successfully blocking the surface whilst remaining in a range of MF(InCl)$<5\cdot 10^{-3}$ which yields the best result. This essential element must cooperate with another element essential for obtaining the desired result.

It must be understood that according to the prior art all conditions were combined to obtain that both the rate of growth of GaInAs and the rate of growth of InP are low.

This result was obtained:
either by choosing a high deposition temperature (650° C.) and a pressure of InCl or molar fraction of InCl which is high for the growth of GaInAs and is low (due to the use of a single source) for the growth of InP;
or by choosing a low deposition temperature (620° C.) still in a pressure of InCl (or molar fraction of InCl) which is low for the growth of InP.

This resulted in numerous vacancies in the layer of GaInAs if $T_D=650°$ C. was chosen and in numerous vacancies in the layer of InP in both cases, the molecule $P_2$ not sufficiently blocking the surface of InP, in contrast with what was expected.

Both in one and in the other case, the rate of growth of the quanternary interface layer was high because this layer of aleatory composition grew rapidly from the vacancies.

According to the invention, on the contrary:
on the one hand the deposition temperature $T_D$ is chosen $<650°$ C. so that the rate of growth of the layer of GaInAs is low and the number of vacancies is small. These conditions have repercussions on the transient state, which is influenced by the initial conditions or the conditions existing just before the beginning of the growth of InP.

On the other hand, the pressure of InCl during the deposition of InP is increased so that the surface remains blocked by Cl, also having only a few vacancies from the beginning of the growth of InP and during this growth. This is obtained by utilizing during the growth of InP both the solid source of InP and the liquid source of In respectively so said second source 23 and third source 22. Then: the chloric species coverage rate is high with respect to the other coverage rates $$\theta(PInCl)>>\theta(P)+\theta_v,$$

the rate of coverage with $P_2$ being indifferent because this molecule $P_2$ partly blocks the surface, which also partly prevents an uncontrolled growth. The rate of growth of InP is then very high, in contrast with the prior art. This is not a disadvantage, in contrast with what had been assumed before.

In these conditions, the transient state at a very high rate of growth cannot be started and the interface layer of quaternary composition has a very small thickness.

Moreover it should be noted that a high pressure of InCl is also favorable for the increase of the rates of coverage $\theta(AsGaCl)$ and $\theta(AsInCl)$ during the growth of GaInAs and for a low rate of growth of GaInAs, as has been stated before.

In these conditions, semiconductor devices of high quality can be obtained and especially quantum wells having a first layer of GaInAs of 10 nm followed by a layer of InP of about 500 nm with an interface of less than 1 nm.

Figure 4:
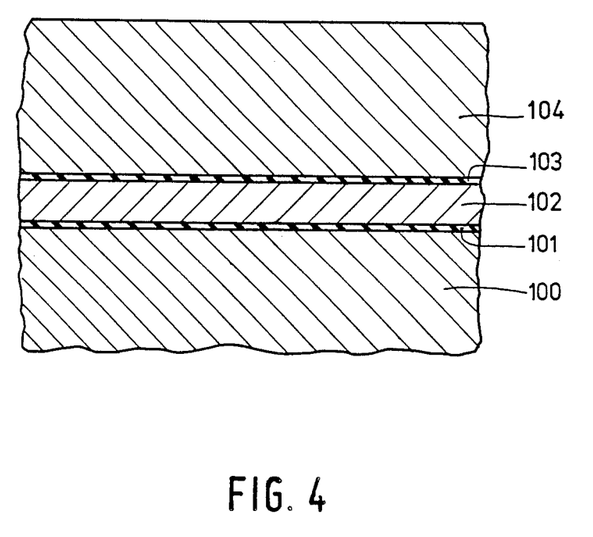
FIG. 4 shows in diagrammatic sectional view a juxtaposition of layers obtained according to the invention.

FIG. 4 shows, formed on an epitaxial layer 100 of InP, an epitaxial layer 102 of InGaAs having a thickness of the order of 10 nm followed by an epitaxial layer 104 of InP having a large thickness of, for example, 500 nm. The layers 101 and 103 are quaternary layers, which appear during the transitions. According to the invention, they have a very small thickness of the order of 1 nm.

The optimum conditions are obtained with:
a deposition temperature $T_D\simeq 620°$ C. or at least 600° C. and 640° C.,
a pressure of InCl which is high both during the growth of GaInAs and during the growth of InP corresponding to a molar fraction of InCl MF(InCl) of the order of $2.7\cdot 10^{-3}$ or at least between $2\cdot 10^{-3}$ and $4\cdot 10^{-3}$.

In order to obtain the molar fractions of InCl desired according to the invention,
to obtain the layer of gallium indium arsenide (GaInAs), simultaneously the product of the source 21 of gallium arsenide (GaAs) and that of the source 22 of indium (In) will be introduced into the chamber of the reactor;
in order to obtain the layer of indium phosphide (InP), simultaneously the product of the source 23 of indium phosphide (InP) and that of the source 22 of indium (In) will be introduced into the chamber of the reactor.

The molar fraction of GaCl used for the growth of GaInAs in the conditions described above [MF(InCl)$\simeq 2.7\cdot 10^{-3}$ and $T_D=620°$ C.] will advantageously be:

$$MF(GaCl)\simeq 3.2\cdot 10^{-3}$$

and the molar fraction of P used for the growth of InP in the same conditions will be:

$$MF(P) \simeq 1.5 \cdot 10^{-3}.$$

These conditions result in a rate of growth of GaInAs of the order of 2 μm/h, which is sufficiently low to satisfactorily dominate the processing of a layer of 10 nm thickness, and in a high rate of growth of InP of the order of 20 to 25 μm/h, in contrast with the prior art and favorable for the processing of layers of InP of large thickness, such as 500 nm or more.

It is important to note that the operating conditions of the invention are not extreme; they can therefore be readily obtained. For these conditions:
- the materials obtained have a high electrical quality;
- the rates of growth are accurately controlled and reproducible;
- the composition of the ternary material is accurately controlled;
- the processing of an interface InP-GaInAs is also of very high quality;
- there is no interruption in the growth between the layers, which results in the possibility of automatization for the formation of multiple quantum wells in a reproducible manner.

Finally, secondary conditions should be taken into account. First the sources themselves are brought to high temperatures, which have influence on the rates of growth, especially on the growth of GaInAs. In order to provide for GaInAs a low rate of growth, the temperatures of the sources must be of the order of 700° to 720° C., for example of 705° C. for $T_D = 620°$ C. In the case in which the temperatures of the sources increase, the rate of growth of GaInAs would also increase. A difference of the order of 80° C. to 100° C. between source temperature and $T_D$ is particularly suitable.

We claim:

1. A method of manufacturing a semiconductor device comprising at least the step of forming by a so-called method of deposition from the chloride vapor phase two superimposed epitaxial layers, the lower layer being made of a ternary compound and the upper layer being made of a binary compound, both of a semiconductor material of the III-V group, characterized in that the operating conditions of deposition temperature and molar fractions of the compounds required to form the layers are chosen so that both the lower layer of ternary material and the upper layer of binary material have before, during and after the transient state corresponding to the passage from the lower layer to the upper layer a maximum coverage rate with chlorine (Cl) atoms.

2. A method as claimed in claim 1, characterized in that the lower epitaxial layer is made of gallium indium arsenide having the formula $Ga_{0.47}In_{0.53}As$ and the upper layer is made of indium phosphide (InP).

3. A method as claimed in claim 1, characterized in that the lower epitaxial layer is made of gallium indium arsenide (Ga In As), the upper epitaxial layer is made of indium phosphide (InP) and gaseous indium chloride (In Cl) is employed to provide the maximum coverage rate with chlorine (Cl) atoms.

4. A method as claimed in claim 3, characterized in that the deposition temperature $T_D$ is considered to be low in the range of from 600° to 640° C., the reacting molar fraction of InCl is considered to be large in the range of from $2.10^{-3}$ to $4.10^{-3}$ and the parameters deposition temperature $T_D$ and molar fraction of InCl during the deposition of the indium phosphide (InP) are chosen in these ranges whilst taking into account the fact that these parameters cooperate in inverse ratio to each other.

5. A method as claimed in claim 4, characterized in that the molar fraction of InCl is chosen equal to $2.7 \cdot 10^{-3}$.

6. A method as claimed in claim 5, characterized in that the deposition temperature $T_D$ is chosen equal to 620° C.

7. A method as claimed in claim 6, characterized in that the sources required to carry out the deposition from the chloride vapor phase first comprise an arsenic trichloride ($AsCl_3$) liquid bubbler (31) and a phosphorus trichloride ($PCl_3$) liquid bubbler (21) brought to a temperature sufficiently high so that flows of hydrogen introduced into these liquid bubblers (31, 33) take along quantities of $AsCl_3$ and $PCl_3$ material, respectively, which are decomposed and then react on solid sources designated as first and second sources, respectively (21), of gallium arsenide (GaAs) of indium and indium phosphide (InP) brought to a temperature $T_S$ higher than the deposition temperature $T_D$, from which reactions become available gallium chloride (GaCl)+As and indium chloride (InCl) P4, respectively, the the gaseous state, and comprise an arsenic chloride ($AsCl_3$) liquid bubbler (32) brought to a temperature sufficiently high so that a flow of hydrogen introduced into this liquid bubbler (32) take as along a quantity of arsenic chloride which is decomposed to produce gaseous hydrochloride HCl, which is taken to a source of liquid indium (22) designated as third source brought to a temperature $T_S$, and from which reaction there becomes available gaseous indium chloride (InCl), and in that, in order to obtain the molar fraction of InCl required, the product of the third source is introduced simultaneously with the product of the first source (21) for processing the layer of gallium indium arsenide (GaInAs), while the product of the third source (22) is introduced simultaneously with the product of the second source (23) for processing the layer of indium phosphide (InP).

8. A method as claimed in claim 7, characterized in that the temperature of the sources $T_S$ is 80° to 100° C. higher than the deposition temperature $T_D$.

9. A method as claimed in claim 8, characterized in that the layers of gallium indium arsenide (GaInAs) and of indium phosphide (InP), respectively, are deposited on a substrate of indium phosphide (InP), and in that the ratio between the partial pressure of indium chloride and the partial pressure of gallium chloride is chosen so as to obtain layers of gallium arsenide of the composition $Ga_{0.47}In_{0.53}As$ permitting of obtaining lattice matching with the substrate.

10. A method as claimed in claim 2, characterized in that the operating conditions include for obtaining a high rate of coverage with chlorine (Cl) of the layer of GaInAs a low deposition temperature $T_D$ of the layer and for obtaining a high rate of coverage with chlorine (Cl) of the layer of InP a large molar fraction of indium chloride MF(InCl) during the formation of the layer of InP.

* * * * *